United States Patent
Prodic et al.

(10) Patent No.: US 11,606,028 B2
(45) Date of Patent: Mar. 14, 2023

(54) SINGLE MODE LOAD TRACKING VOLTAGE MODE CONTROLLER WITH NEAR MINIMUM DEVIATION TRANSIENT RESPONSE

(71) Applicant: Würth Elektronik eiSos GmbH & Co. KG, Waldenburg (DE)

(72) Inventors: Aleksandar Prodic, Toronto (CA);
Tom Moiannou, Markham (CA);
Aleksandar Radic, Toronto (CA);
Alexander Gerfer, Odenthal (DE);
Mahmoud Shousha, Eching (DE);
Martin Haug, Munich (DE)

(73) Assignee: Würth Elektronik eiSos GmbH & Co. KG, Waldenburg (DE)

(*) Notice: Subject to any disclaimer, the term of this patent is extended or adjusted under 35 U.S.C. 154(b) by 288 days.

(21) Appl. No.: 16/976,323

(22) PCT Filed: Jan. 31, 2019

(86) PCT No.: PCT/EP2019/052337
§ 371 (c)(1),
(2) Date: Aug. 27, 2020

(87) PCT Pub. No.: WO2019/166177
PCT Pub. Date: Sep. 6, 2019

(65) Prior Publication Data
US 2021/0050781 A1    Feb. 18, 2021

Related U.S. Application Data

(60) Provisional application No. 62/636,613, filed on Feb. 28, 2018.

(51) Int. Cl.
*H02M 3/157*    (2006.01)
*G01R 19/14*    (2006.01)
(Continued)

(52) U.S. Cl.
CPC .......... *H02M 3/157* (2013.01); *G01R 19/14* (2013.01); *H03K 5/24* (2013.01); *H02M 1/0009* (2021.05); *H02M 3/1566* (2021.05)

(58) Field of Classification Search
CPC ..... G05F 1/00; G05F 1/10; G05F 1/12; G05F 1/46; G05F 1/455; G05F 1/45;
(Continued)

(56) References Cited

U.S. PATENT DOCUMENTS

2008/0258701 A1 * 10/2008 Liu ................ H02M 3/1588
323/328
2014/0292300 A1    10/2014 Yan et al.
(Continued)

FOREIGN PATENT DOCUMENTS

CN    105 048 808 A    11/2015
EP    3 059 844 A1    8/2016

OTHER PUBLICATIONS

Moiannou Tom et al., A single mode load tracking voltage mode controller with near minimum deviation transient response, 2018 IEEE Applied Power Electronics Conference and Exposition (APEC), IEEE, Mar. 4, 2018 (Mar. 4, 2018), pp. 298-303.

*Primary Examiner* — Thienvu V Tran
*Assistant Examiner* — Nusrat Quddus
(74) *Attorney, Agent, or Firm* — McGlew and Tuttle, P.C.

(57) ABSTRACT

A single-mode quasi constant frequency controller apparatus for controlling output voltage deviation during one or more load transients, the controller apparatus comprising: a converter receiving one or more operational control parameters; a load tracking modulator configured to receive sensory inputs representative of a capacitor current polarity, and to control one or more power transistors of the converter such that an inductor current matches a load current cycle and reconstructs a desired inductor current ripple by splitting both an on-time for inductor charging and an off-time for
(Continued)

inductor discharging into a current correction phase (CCP) and a ripple reconstruction phase (RRP), the load tracking modulator communicating the one or more operational control parameters for controlling the one or more power transistors.

7 Claims, 13 Drawing Sheets

(51) Int. Cl.
*H03K 5/24* (2006.01)
*H02M 1/00* (2006.01)
*H02M 3/156* (2006.01)

(58) Field of Classification Search
CPC ... G05F 1/445; G05F 1/66; G05F 1/40; G05F 1/42; G05F 1/44; G05F 1/462; G05F 1/52; G05F 1/56; G05F 3/10; G05F 3/16; G05F 3/18; G05F 3/185; G05F 3/20; G05F 3/26; G05F 3/30; G05F 3/205; G05F 3/22; G05F 3/24; G05F 3/222; G05F 3/242; G05F 3/225; G05F 3/227; G05F 3/245; G05F 3/247; G05F 3/262; G05F 3/265; G05F 3/267; G05F 1/575; G05F 1/30; G05F 1/33; G05F 1/32; G05F 1/34; G05F 1/38; H02M 5/2573; H02M 1/081; H02M 5/293; H02M 7/12; H02M 3/10; H02M 3/125; H02M 3/13; H02M 3/135; H02M 3/145; H02M 3/15; H02M 3/155; H02M 3/156; H02M 3/158; H02M 3/1588; H02M 2003/1566; H02M 3/1582; H02M 2003/1557; H02M 1/12; H02M 3/3155; H02M 3/33507; H02M 3/33546; H02M 7/1557; H02M 7/1626; H02M 1/4208; H02M 7/53871; H02M 7/219; H02M 7/151; H02M 1/4233; H02M 5/4585; H02M 7/217; H02M 1/08; H02M 7/1552; H02M 7/1623; H02M 1/4225; H02M 3/33592; H02M 3/073; H02M 3/137; H02M 7/10; H02M 7/00; H02M 7/06; H02M 7/064; H02M 7/068; H05B 39/048; B23K 11/24; H04B 2215/069; H02J 7/12

See application file for complete search history.

(56) References Cited

U.S. PATENT DOCUMENTS

2017/0249001 A1* 8/2017 Roszel ............... H04L 9/088
2017/0288557 A1* 10/2017 Fang ................ H02M 1/4258
2020/0052576 A1* 2/2020 Murakami ........... H02M 7/219

* cited by examiner a)

b)

a)

b)

SINGLE MODE LOAD TRACKING VOLTAGE MODE CONTROLLER WITH NEAR MINIMUM DEVIATION TRANSIENT RESPONSE

CROSS-REFERENCES TO RELATED APPLICATIONS

The present patent application claims the priority of U.S. provisional application 62/636,613, the content of which is incorporated by reference herein.

FIELD

Embodiments of the present disclosure generally relate to the field of power engineering, and more specifically, embodiments relate to systems and methods for managing voltage deviation during load transients.

INTRODUCTION

Modern switch-mode power supplies (SMPS), especially those used in point-of-load (PoL) applications, need to meet challenging requirements for both steady state and dynamic voltage regulation. In targeted applications, for converters processing from a fraction of a watt to tens of watts, the dynamic performance of SMPS controllers have a dominant influence on the sizing of the output filter capacitor. As required output voltages decrease and load currents increase, meeting output voltage regulation requirements during transients requires greatly increased output capacitance.

Power supplies in portable applications have already been shown to consume a significant portion of printed circuit board (PCB) real estate. Driven in large part by increasing output filter capacitance requirements this number has been growing and is likely to continue to grow. Therefore, it is important to improve the dynamic performance of controllers as much as possible to limit this growth in area consumption.

SUMMARY

Transient handling is an important consideration of SMPS is a challenging technical problem to overcome. An improved deviation controller is proposed that utilizes unconventional approaches in handling deviations in voltage. The controller, of various embodiments, is a single-mode quasi constant-frequency controller that provides practically minimum output voltage deviation during load transients.

This control mechanism reduces or eliminates the need for two separate controllers for steady-state and transient operation and the associated potential mode transition problems which are characteristic of numerous fast response solutions.

The controller relies on the detection of changes in the output capacitor current polarity and, in some embodiments, a PI compensator to provide fast transient response and tight voltage regulation.

The effectiveness of this mixed-signal controller is demonstrated with a 600 kHz, 15 W single-phase buck converter based experimental prototype. During load transients, the inductor current is shown to be corrected within one switching cycle with near-minimum output voltage deviation.

In accordance with an aspect, a single-mode quasi constant frequency controller apparatus for controlling output voltage deviation during one or more load transients, the controller apparatus comprising: a converter receiving one or more operational control parameters; a load tracking modulator configured to receive sensory inputs representative of a capacitor current polarity, and to control one or more power transistors of the converter such that an inductor current matches a load current cycle and reconstructs a desired inductor current ripple by splitting both an on-time for inductor charging and an off-time for inductor discharging into a current correction phase (CCP) and a ripple reconstruction phase (RRP), the load tracking modulator communicating the one or more operational control parameters for controlling the one or more power transistors.

In accordance with another aspect, the controller includes a polarity detector configured to sense the capacitor current polarity.

In accordance with another aspect, the load tracking modulator includes a first half duty digital pulse width modulator and a second half duty digital pulse width modulator.

In accordance with another aspect, a positive capacitor current polarity triggers an onset of the RRP.

In accordance with another aspect, during the RRP, the load tracking modulator controls the converter to maintain an on-time for an additional period to reconstruct a ripple.

In accordance with another aspect, during the one or more load transients where the one or more load transients are light to heavy transients, a corresponding load current resultant from a corresponding load transient causes an extension of CCP duration during the on-time of the converter.

In accordance with another aspect, during the one or more load transients where the one or more load transients are heavy to light transients, a corresponding load current resultant from a corresponding load transient causes an extension of CCP duration during the off-time of the converter.

Alternative approaches and variations thereof are considered. In some embodiments, the approach is provided in the form of an improved process and method for handling power transients. In other embodiments, the approach is provided in the form of a control method provided in the form of sequential control signals received from a load tracking modulator adapted for a buck converter circuit.

The controller may, in some embodiments, be standalone and connected to a converter (for transmitting control signals), or in other embodiments, may include the converter as part of a combination.

DESCRIPTION OF THE FIGURES

In the figures, embodiments are illustrated by way of example. It is to be expressly understood that the description and figures are only for the purpose of illustration and as an aid to understanding.

Embodiments will now be described, by way of example only, with reference to the attached figures, wherein in the figures.

DETAILED DESCRIPTION

In recent years, numerous fast load-transient response controllers have been proposed. Examples include time-optimal and minimum deviation controllers. For direct energy transfer converters, such as a buck converter, the usage of such controllers results in what is practically the minimum achievable voltage deviation for a given converter and load-step.

This presents the opportunity to drastically reduce the output capacitor volume. Still, the approaches suffer from drawbacks that have slowed down their wider adoption in targeted applications. Time-optimal controllers suffer from relatively high computational complexity, making them impractical in targeted hardware-limited low-cost applications. Minimum deviation controllers solve this issue and provide practically minimum output voltage deviation without increasing the computational burden on the digital, PID based, voltage mode controllers.

Also, at the expense of increased voltage recovery time, minimum deviation controllers result in a significantly lower peak inductor current than time-optimal solutions, allowing for the use of smaller inductors. However, both minimum-deviation and most time-optimal solutions operate in two modes.

They combine a linear compensator for steady-state regulation with additional transient suppression circuits, which detect and respond to load transients. This two-mode operation is usually not preferable. This is mostly due to potential stability problems during mode transitions and/or additional hardware required to ensure seamless transitions.

Systems, apparatuses, devices, controllers, and machine interpretable instruction sets stored on computer readable media are described in various embodiments. A new controller is proposed that introduces the single-mode minimum-deviation approach based controller of FIG. 1.

Unlike previous solutions, it uses only one mode of operation for both steady state operation and during transients, eliminating potential mode transition related stability problems while also further simplifying the hardware implementation requirements.

As noted above, a reduction in complexity aids in addressing problems associated with cost, size limitations on PCBs, and a total number of components.

Figure 1:
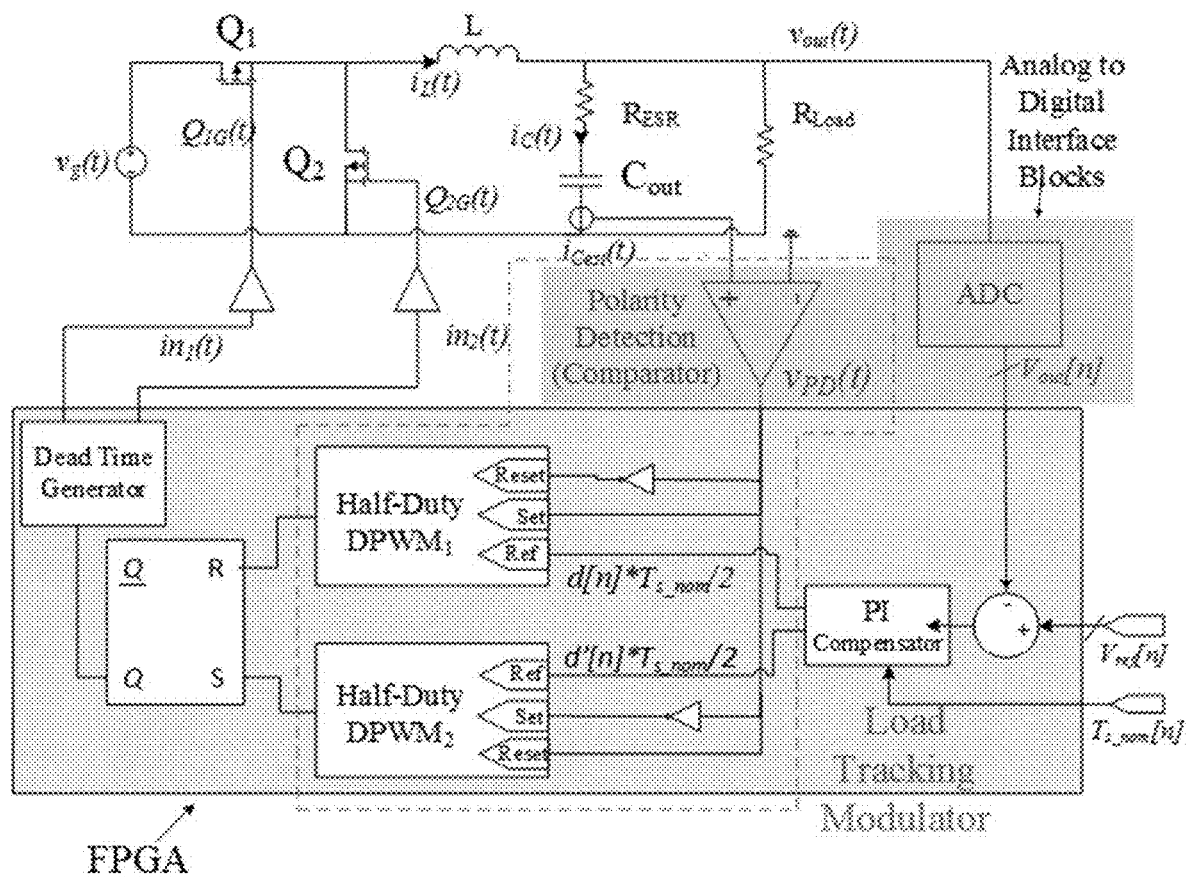
FIG. 1 is a block schematic of a buck converter regulated by a single mode load tracking minimum deviation controller, according to some embodiments.

The introduced controller is shown in FIG. 1. It is a modification of a voltage mode controller where the conventional pulse width modulator (PWM) is replaced by the load tracking modulator block.

This block consists of two half duty digital pulse width modulator blocks ($DPWM_1$ and $DPWM_2$) and one capacitor current polarity detection block. The half-duty modulators use information about the capacitor current polarity to gate the power transistors ($Q_1$ and $Q_2$) such that the inductor current is made to match the load current cycle by cycle while also reconstructing the desired inductor current ripple. It does this by splitting both the on-time ($Q_1$ on, $Q_2$ off, inductor charging) and the off-time ($Q_1$ off, $Q_2$ on, inductor discharging) into two separate phases each. These are called the "current correction phase" (CCP) and "ripple reconstruction phase" (RRP).

Figure 2:
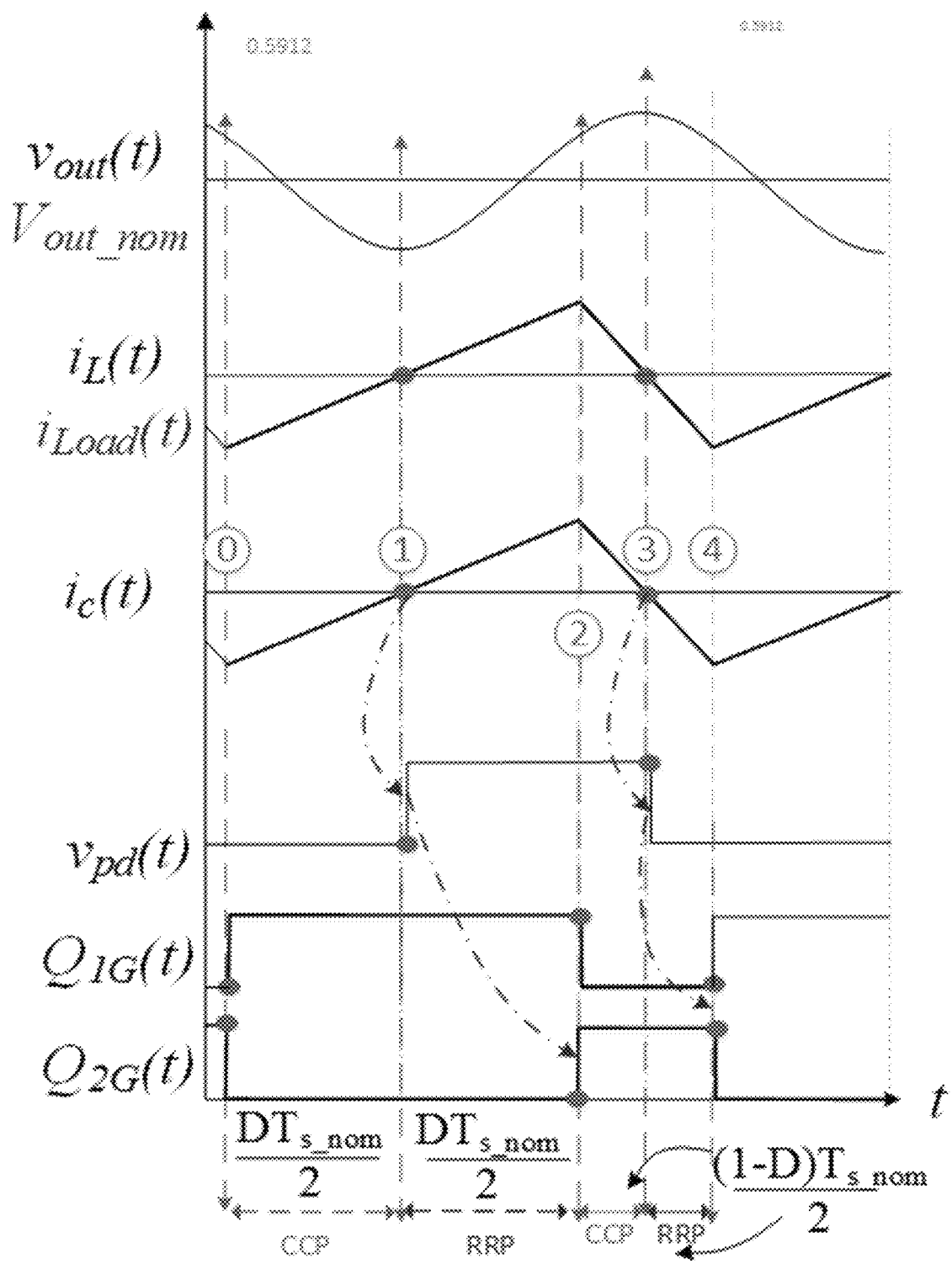
FIG. 2 is a waveform diagram depicting steady-state waveforms of the single mode minimum deviation controller, according to some embodiments. Top to Bottom: output voltage, nominal output voltage, inductor current, load current, capacitor current, output of zero-current polarity detector output and gating signals of power transistors.
Figure 3:
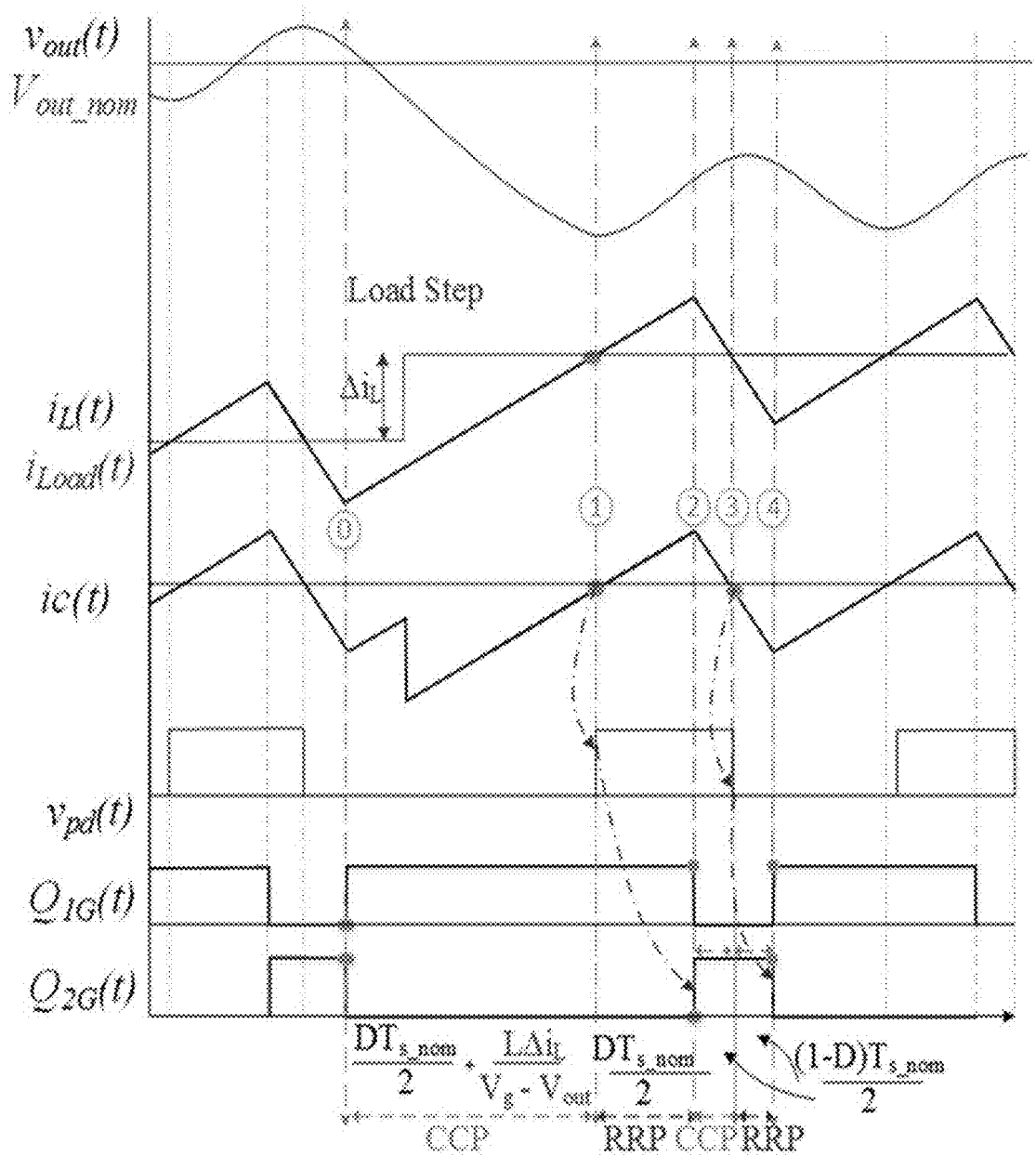
FIG. 3 is a waveform diagram depicting signal waveforms during a load transient where the inductor current is corrected, according to some embodiments. The diagram shows output voltage, nominal output voltage, inductor current, load current, capacitor current, polarity detector output and gating signals.

The functionality of the controller can be better understood with the help of FIGS. 2 and 3. FIG. 2 depicts the operation of a buck converter running with the introduced control scheme in steady-state. At point 0, the converter enters its on-state. $Q_1$ is on, $Q_2$ is off, and the inductor current is charging up. This first segment is its on-state current correction phase (CCP).

This phase runs until the inductor current equals (or otherwise exceeds) the load current (point 1 in FIG. 2), which in turn causes the capacitor current polarity to change and become positive. This sends the output of the polarity detector, $v_{pd}(t)$ high. This "sets" the half-duty modulator $DPWM_1$ which marks the beginning of the on-time ripple reconstruction phase (RRP). Once set, $DPWM_1$ keeps the converter in its on-state for an additional $DT_{s\_nom}/2$ in order to reconstruct its ripple. At this point the output of $DPWM_1$ will go high and push the converter into its off-state.

This is marked by point 2 in FIG. 2. Now, $Q_1$ is turned off, $Q_2$ is turned on and the inductor current is discharging. The first portion of its off-state is again a current correction phase. It will remain in its current correction phase until the instantaneous inductor current equals (or otherwise is less than) the load current, which occurs at point 3.

The capacitor current again experiences a change in polarity, setting $v_{pd}(t)$ low. The converter is again in a ripple reconstruction phase. This activates DPWM$_2$ which keeps the converter in its off-state for an additional $(1-D)T_{s\_nom}/2$ to reconstruct the ripple. This is point 4 in FIG. 2. The output of DPWM$_2$ then goes high, putting the converter back into its on-state, and the cycle repeats.

In the event of a transient, the controller still operates just as it does in steady-state. However, the load-tracking modulator will extend either the on-time or the off-time (depending on the transient) and thus the period for that cycle to address the transient. This is shown in FIG. 3 for a light-to-heavy transient.

As the output of the polarity detector cannot go high until the inductor current equals (or exceeds) the load current, the duration of the CCP of the on-state is automatically extended. Once the inductor current has increased to the point that it equals the load current, the converter enters its RRP and the controller proceeds as before.

Heavy to light transients are addressed similarly, however it is the CCP of the off-state that is extended as opposed to that of the on-state. From this it can be seen that this control method requires no special blocks to detect load transients, it simply responds to them as part of its normal operation.

Figure 4:
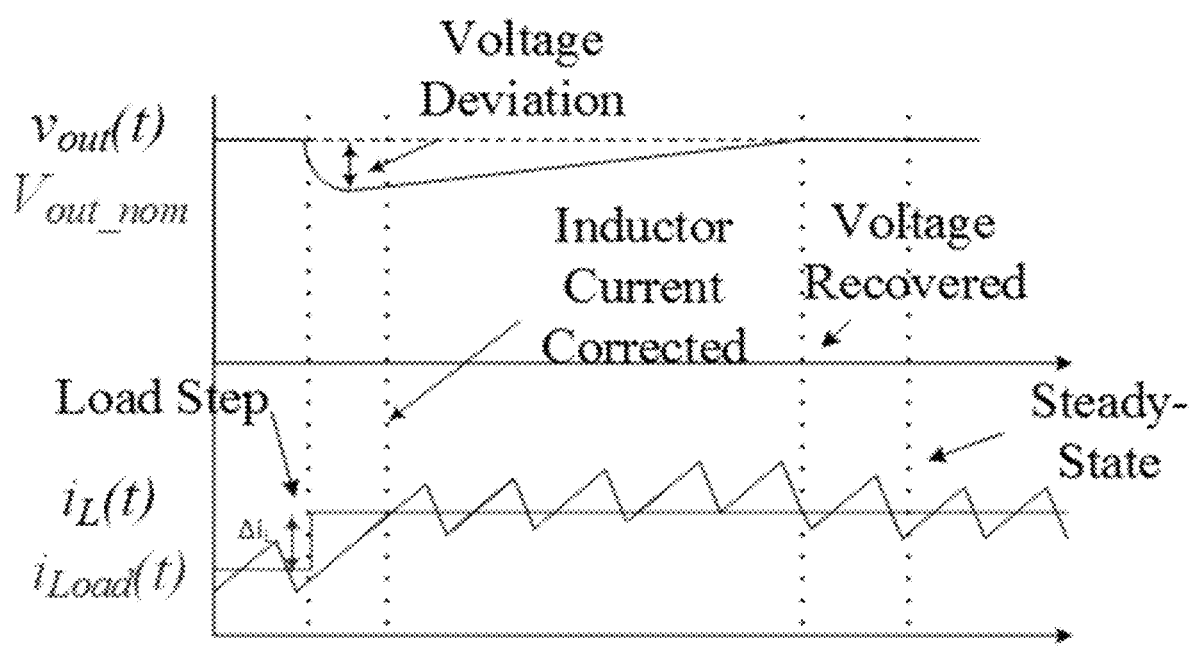
FIG. 4 is a waveform diagram depicting signal waveforms during the voltage recovery phase neglecting output voltage ripple, according to some embodiments.

As shown in FIG. 3, there will be an error in the voltage even after the inductor current has been corrected. This happens because some charge is lost before the inductor current is corrected. Voltage recovery is handled by the compensator afterwards as shown in FIG. 4, this is similar to conventional voltage mode control.

The speed of this recovery depends on the compensator implemented. This controller may be thought of as a voltage mode controller with one major difference, it is capable of correcting inductor current within a single cycle thus achieving near minimum output voltage deviation. Experimental results taken from a physical prototype are presented below.

Analysis of Switching Period Variation

For the converter's on-time, the duration of the current correction phase can be determined by Eq. 1.

$$T_{ON} = \frac{DT_{s\_nom}}{2} + \frac{\Delta i_{L\_trans}}{\left(\frac{V_g - V_{out}}{L}\right)} \qquad (1)$$

Where $\Delta i_{L\_trans}$ is the magnitude of any load step that may have occurred. During steady-state operation $\Delta i_L = 0$, thus the converter's on-time, which is equal to the sum of its CCP and RRP during steady-state operation is found by Eq. 2.

$$T_{ON\_SS} = \frac{DT_{s\_nom}}{2} + \frac{DT_{s\_nom}}{2} = DT_{s\_nom} \qquad (2)$$

Similarly, in the absence of load-steps, the CCP and RRP of the off-time have equal durations of $((1-D)Ts\_nom)/2$. The sum of these provide the off-time.

$$T_{Off\_SS} = \frac{(1-D)T_{s\_nom}}{2} + \frac{(1-D)T_{s\_nom}}{2} = (1-D)T_{s\_nom} \qquad (3)$$

Hence the effective steady-state period $T_{SW\_ss}$, defined as the duration required to complete steps 0 through 4 in the absence of disturbances, will be equal to Ts_nom.

$$T_{SW\_SS}(1-D)T_{s\_nom} + DT_{s\_nom} = T_{s\_nom} \qquad (4)$$

In the case of a load change between points 0 and 1, shown in FIG. 3, the switching period of the converter changes over one switching cycle. In this case, the switching period can be, calculated using the same procedure and taking non-zero value of $\Delta i_{L\_trans}$ into account, i.e.

$$T_{SW\_trans} = (1-D)T_{s\_nom} + DT_{s\_nom} + \frac{\Delta i_{L\_trans}}{\left(\frac{V_g - V_{out}}{L}\right)}. \qquad (5)$$

Similar calculations can be made for a negative load transient. In general the period of the converter will be extended only when a transient occurs. Otherwise, it will be equal to TSW_SS.

Extension to Multi-Phase Operation

This control scheme can be extended to multi-phase converters. This is most easily accomplished by comparing the inductor current in each phase to half of the load current as opposed to using the estimated capacitor current.

Figure 5:
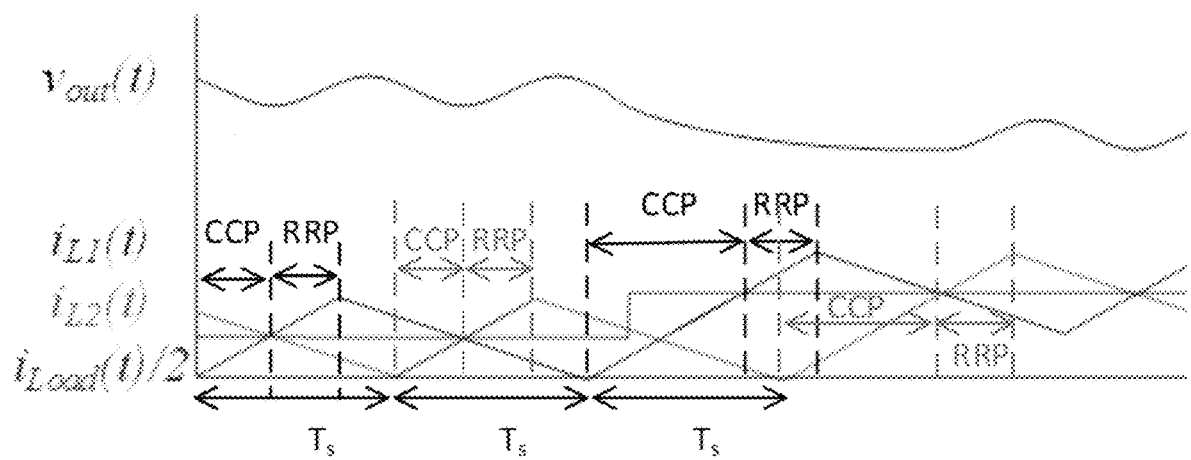
FIG. 5 is a waveform diagram depicting output voltage, inductor currents, and load current for control scheme applied to a 2-phase buck converter, according to some embodiments.

FIG. 5 shows key waveforms for the two-phase case where the period is $2T_s$. The modulator behaves much the same as it does in the single-phase case, however instead of using the zero crossing point of the capacitor current (which corresponds to a shift in polarity) it uses the point where the inductor current equals half the load current. Furthermore, the second phase may not enter its on-state until $T_s$ has elapsed after the first phase entered its on-state.

Following this approach this control scheme may be extended to n-phases by comparing the current in each phase to the load current divided by n. An added benefit of this control scheme is that it ensures currents are shared equally in multi-phase converters. However, unlike the single-phase implementation, it cannot be implemented with a single non-intrusive sensor. Simulation results for the 2-phase example are provided below.

Experimental Prototype and Practical Implementation

Figure 6:
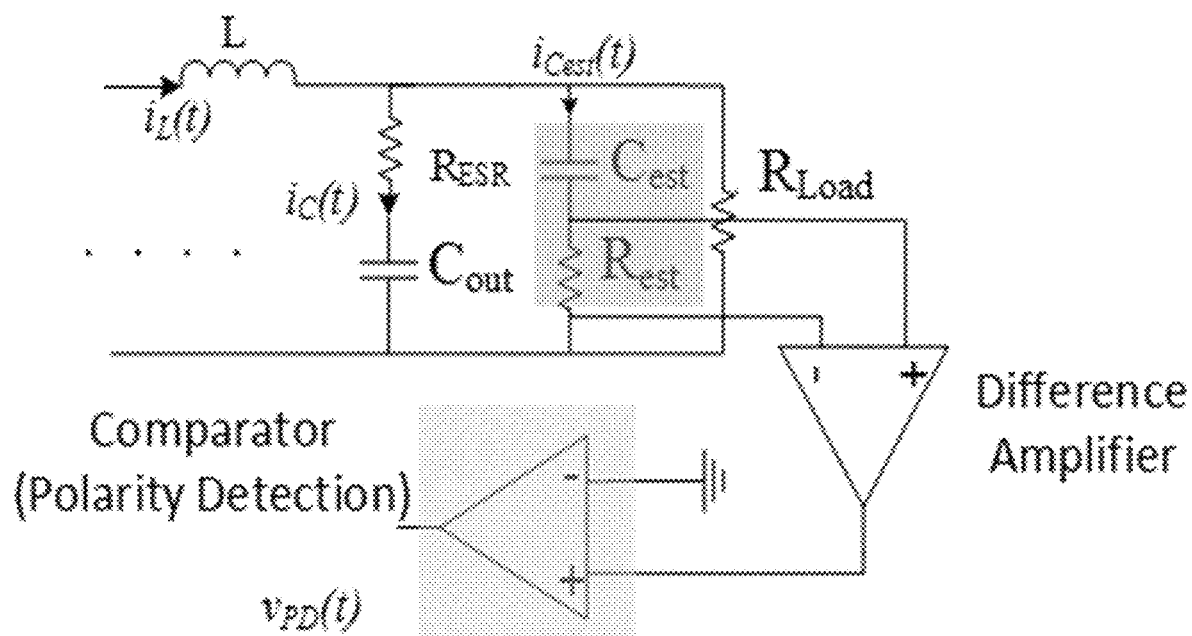
FIG. 6 is a circuit schematic diagram illustrating a capacitor current estimation circuit and polarity detector (simply an analog comparator), according to some embodiments. The time constant $R_{est}C_{est}$ equals that of $R_{ESR}C_{out}$.

A single-phase buck converter based prototype was made with a switching frequency of 600 kHz. Several properties of this prototype are shown in Table 1. As described in section II. This control scheme makes use of the capacitor current. More specifically, this controller requires the accurate detection of changes in the polarity of the output capacitor current. To avoid placing an intrusive sensor in series with the capacitor an estimation circuit is used. This is done by placing an RC circuit in parallel with the output capacitor whose time constant is matched with that of the output capacitor and its ESR [14]-[16]. This is shown in FIG. 6. Previous implementations have demonstrated that auto-matching implementations of this approach can accurately detect the capacitor current polarity and zero current crossing points with a low silicon area [16].

TABLE I

SINGLE-PHASE PROTOTYPE PARAMETERS

| Parameter | Value |
|---|---|
| $C_{out}$ | 100 µF |
| Power | 15 W |
| $R_{est}$ | 10 mΩ |

TABLE I-continued

SINGLE-PHASE PROTOTYPE PARAMETERS

| Parameter | Value |
|---|---|
| L | 3.3 μH |
| $F_{SWnom}$ | 600 kHz |
| $V_G$ | 12 V |
| $V_{out}$ | 3.3 V |

Figure 7:
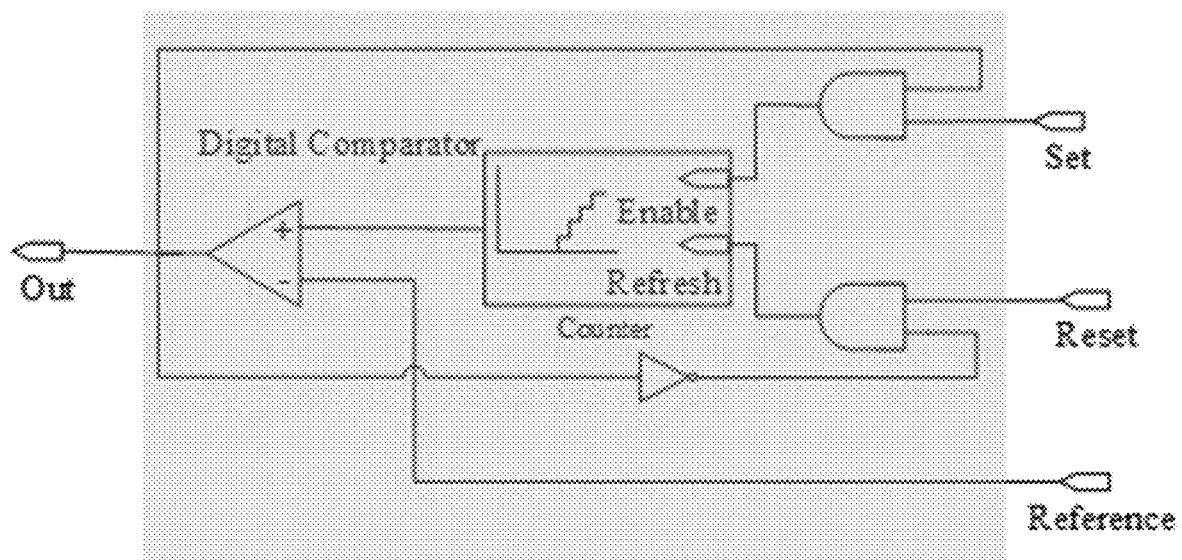
FIG. 7 is a circuit schematic diagram illustrating a structure of the "half-duty" DPWM block that is being used, according to some embodiments.

FIG. 7 depicts a block diagram of the half-duty DPWM cell. It consists of a counter and a digital comparator. The set pin is triggered by a pulse of any duration. It causes the counter to begin counting up. The output of the half-duty DPWM cell goes high once the counter exceeds the value of the reference supplied to it. The reset pin can also be triggered by a pulse of any duration, and causes the counter to reset to zero. After a reset, the counter will not count until another set pulse has been received. The counter may only be set if the output of the DPWM is low and only reset if the output of the DPWM is high.

Simulation and Experimental Results

Figure 8:
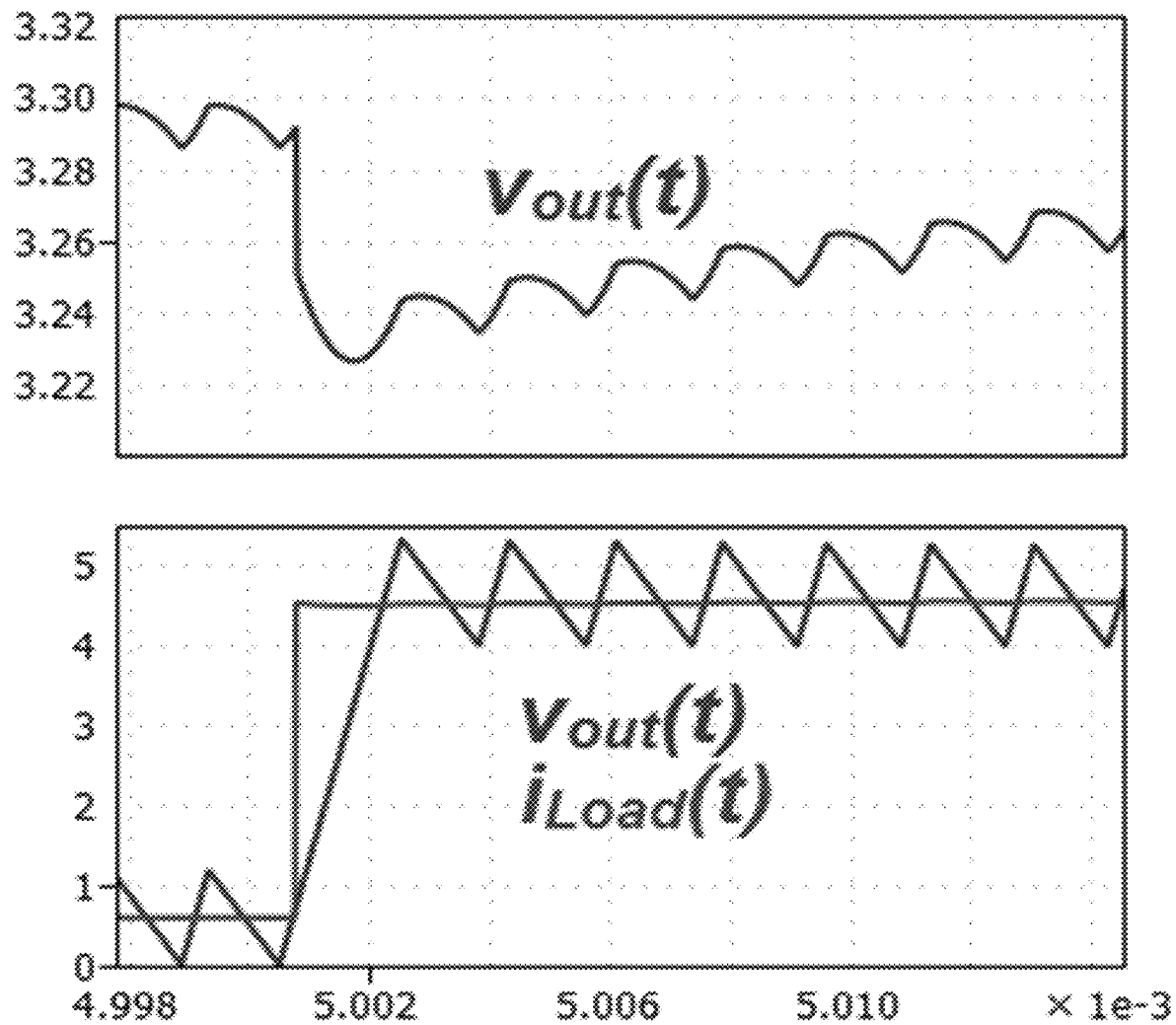
FIG. 8 includes waveform diagrams depicting simulation results showing the transient response in a single-phase buck converter, according to some embodiments.
Figure 9:
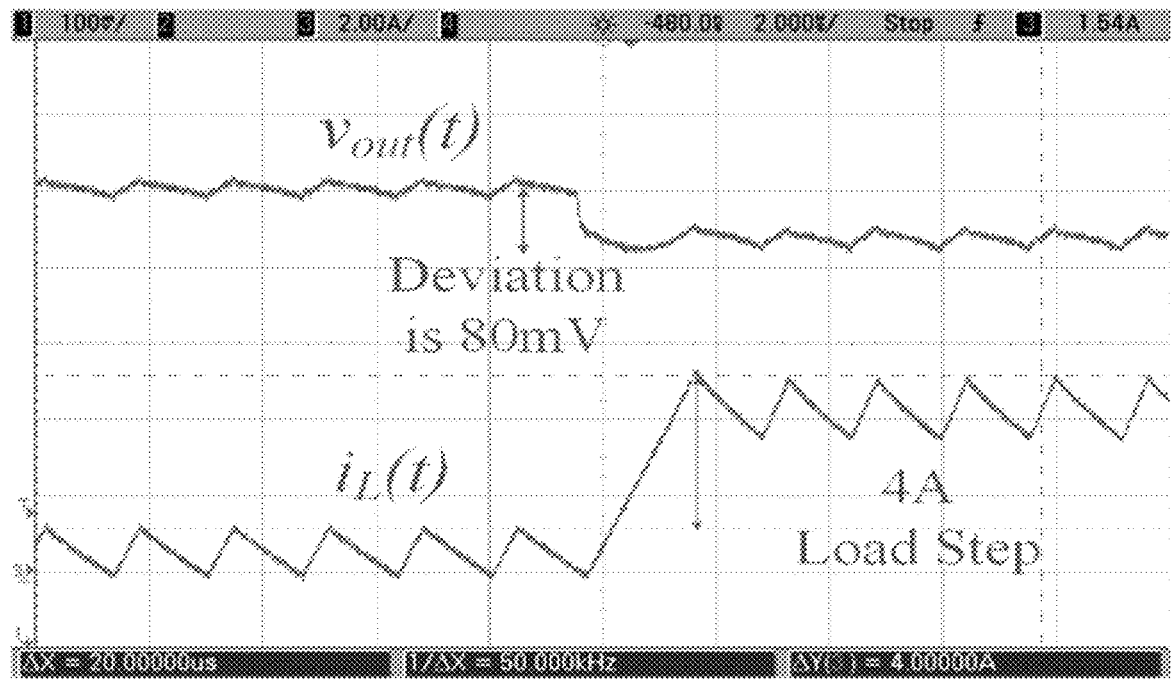
FIG. 9A is a waveform diagram illustrating results from an oscilloscope showing output capacitor voltage and inductor current after 4 A light to heavy load step, ($I_{Load}$ 0.6→4.6 A), according to some embodiments. Voltage is 100 mV/div and current is 2 A/div. Timescale is 2 us/div.
FIG. 9B is a waveform diagram that depicts a zoomed-out version of the same load step, showing the voltage recovery phase, timescale set to 500 us/div, according to some embodiments.
Figure 9:
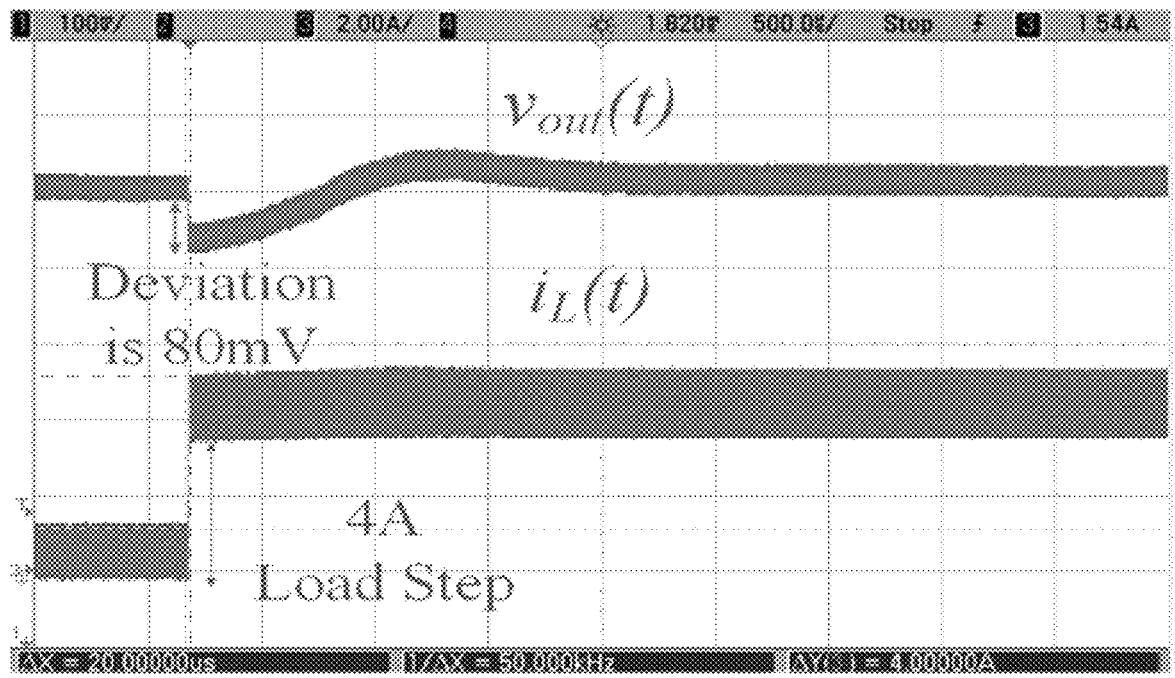
Figure 10:
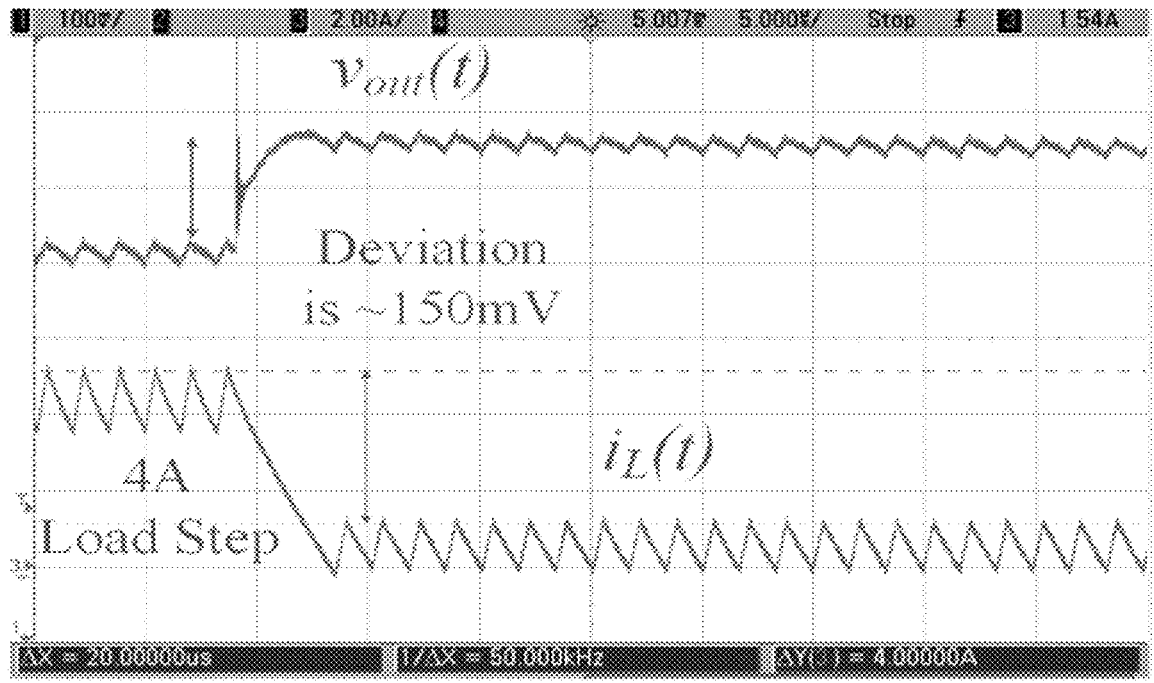
FIG. 10A is a waveform diagram illustrating results from an oscilloscope showing the output capacitor voltage and inductor current after load step of 4 A, ($I_{Load}$=4.6 A→0.6 A), according to some embodiments. The current and voltage scales are 2 A/div and 100 mV/div respectively. Timescale is 5 us/div.
FIG. 10B is a waveform diagram depicting a zoomed out version of the same load step, showing the voltage recovery phase, timescale is 200 us/div, according to some embodiments.
Figure 10:
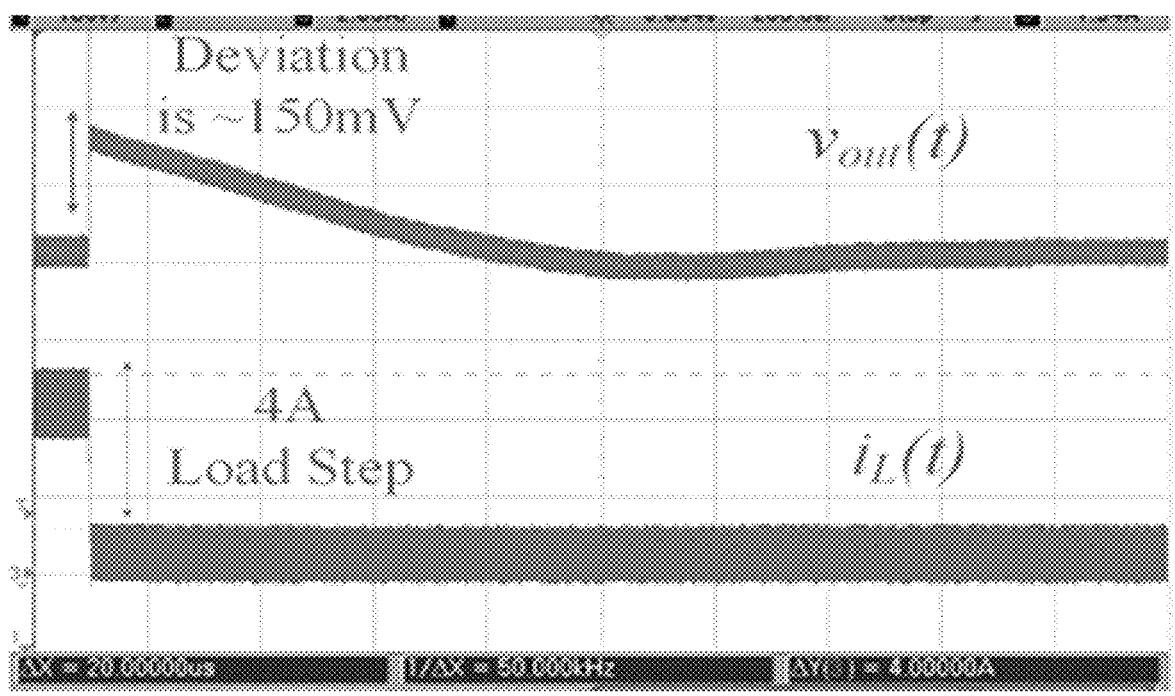

To verify the effectiveness of the introduced method an experimental prototype was made based on the diagrams of FIGS. 1, 6 and 7. Important parameters of this prototype are shown in Table I. The digital controller is implemented using an FPGA based system, while the additional analog components, shown in FIGS. 1 and 6 are implemented using off-the-shelf ADCs, comparators and operational amplifiers. FIG. 8 depicts simulation results whereas FIGS. 9-12 are physical measurements. FIG. 8 shows a simulation of the controller responding to a 4 A, 15% to 100% light to heavy load step. FIG. 9 shows experimental results taken from the prototype for the same transient, while FIG. 10 shows its response to an opposite transient. As in FIG. 8, it can be seen that after the current has been corrected, the voltage ceases to change. This indicates that the current has been correctly adjusted. It can be seen in both FIGS. 9.b and 10.b that the inductor current does not change significantly after the initial correction. The compensator then works to recover the lost voltage.

Figure 11:
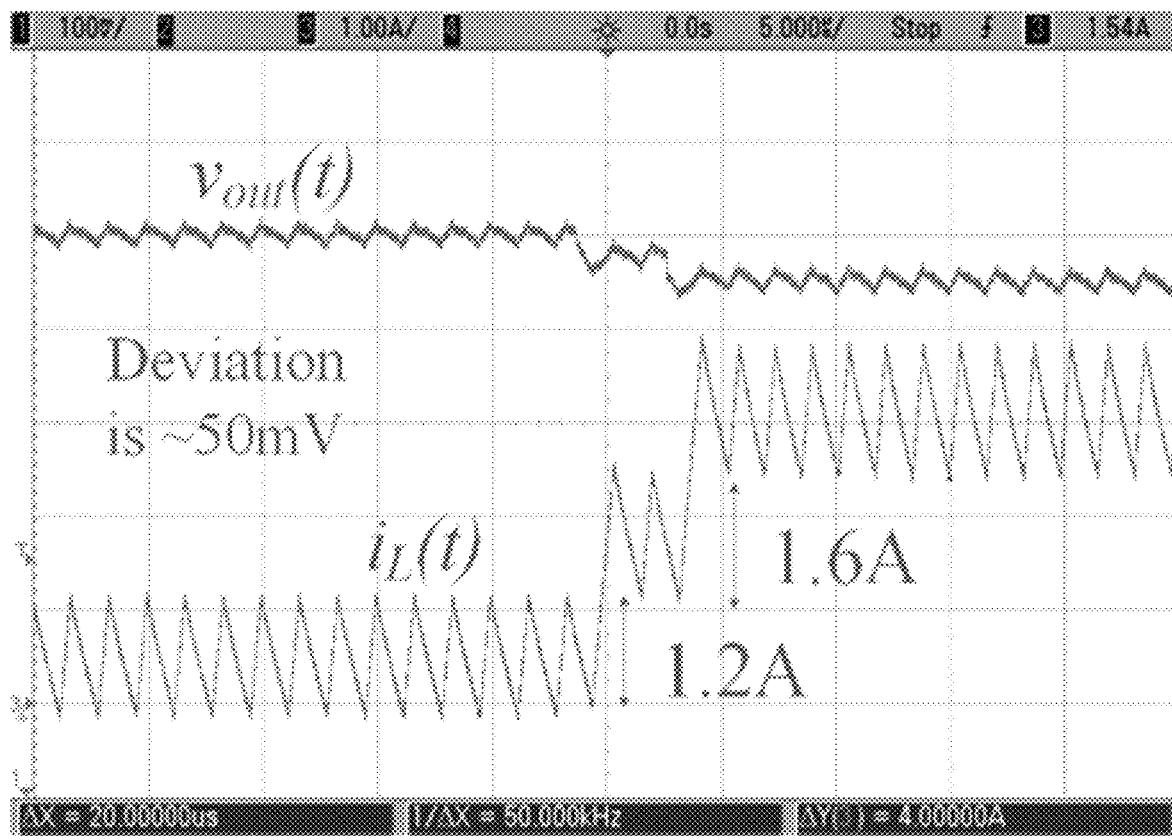
FIG. 11 is a waveform diagram from a oscilloscope showing inductor current and output voltage for consecutive load steps of 1.2 A and 1.6 A ($I_{Load}$=0.6 A→1.8 A→3.4 A), according to some embodiments. The current scale is 1 A/div, the voltage scale is 100 mV/div, the timescale is 5 us/div.
Figure 12:
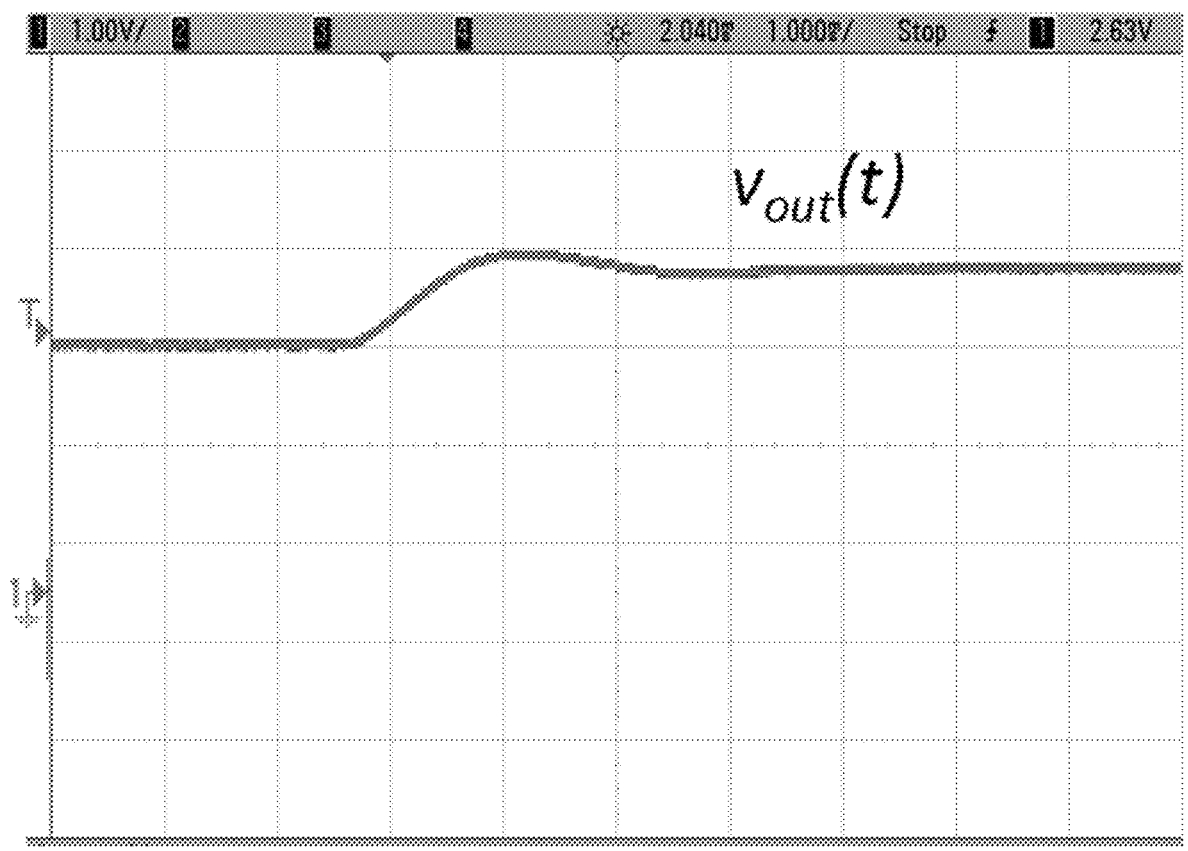
FIG. 12 is a waveform diagram from a oscilloscope showing output voltage for a 800 mV reference step, the voltage scale is 1 V/div whereas the timescale is 1 ms/div, according to some embodiments.

FIG. 11 shows the response of the controller for consecutive load transients. After the first 1.2 A transient occurs the voltage begins to drop, the drop ceases occurring once the current has been corrected. A second 1.6 A transient then occurs which causes the voltage to again drop until the current is corrected. FIG. 12 shows the output voltage during a reference voltage step. This transition occurs smoothly indicating the controller's stability.

Figure 13:
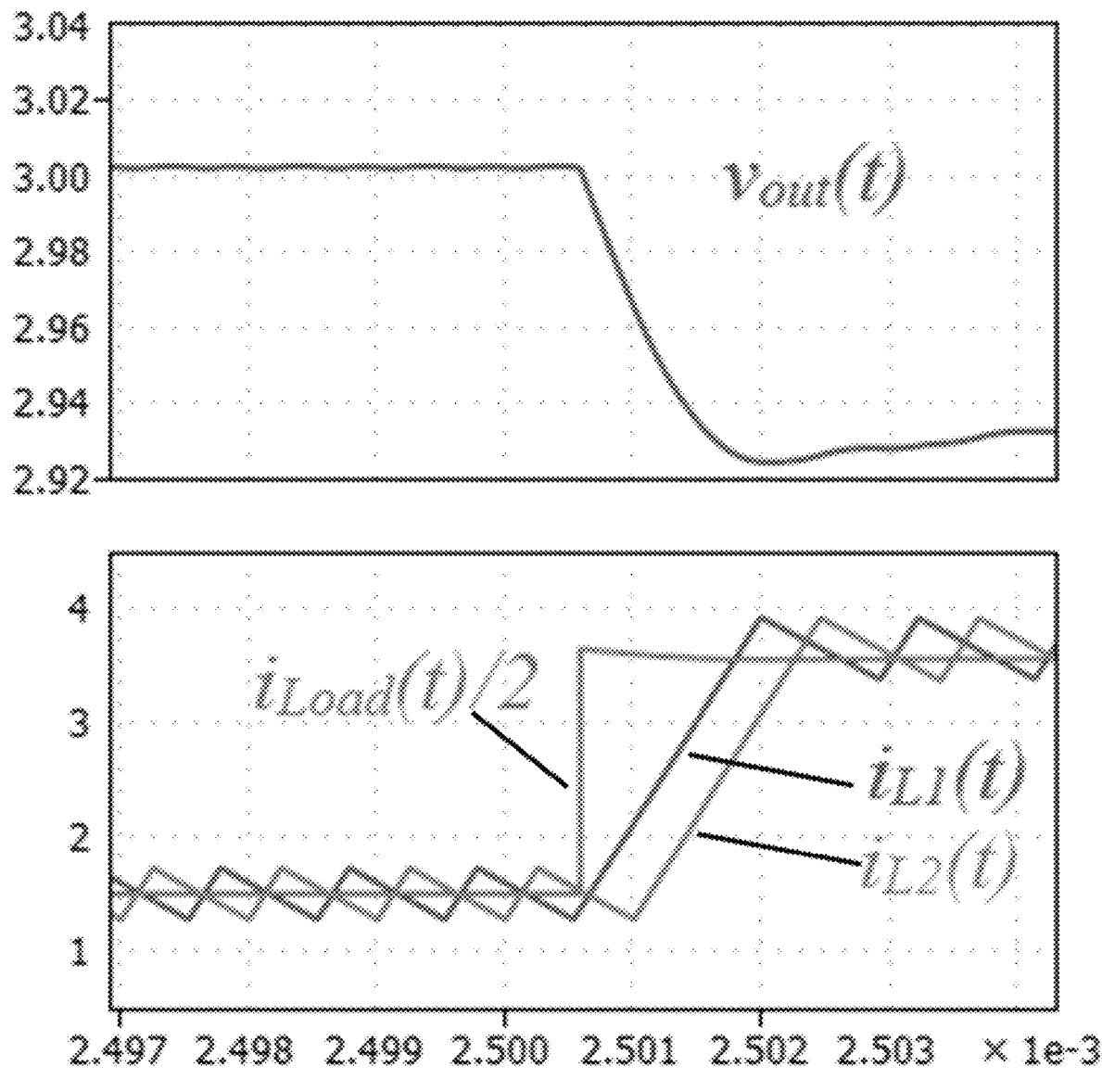
FIG. 13 is a waveform diagram depicting simulation results showing the load-transient response for a 2-phase buck converter, according to some embodiments.

It can be seen that the single mode controller reconstructs the inductor current to its new steady state value over a single switching cycle with near minimum output voltage deviation. Also, it can be seen that due to the single mode of operation a smooth settling of the voltage is achieved without toggling problems often existing in dual mode solutions Lastly, FIG. 13 shows simulation results for a load-step on a 2-phase converter utilizing the introduced control scheme. In this simulation the control scheme is implemented as described in section II.b. It can be seen that the sum of the inductor currents are made to match the load in just one switching action (per phase) while otherwise causing the converter to behave like a conventional 2-phase interleaved buck converter.

A simple single mode quasi constant-frequency near minimum-deviation control method and its implementation have been presented. The introduced controller provides recovery of the inductor current to its new steady state value in a single switching cycle and, thus, results in nearly the minimum possible output voltage deviation for direct energy transfer converters. The key new element of the controller is load-tracking modulator, which replaces a conventional PWM of a voltage mode controller with two half-duty DPWMs and a capacitor polarity detector. The controller operates in the same manner both in steady-state and during transients eliminating the need for two separate control blocks and, consequently, avoiding mode toggling problems. The effectiveness of the control method has been verified experimentally.

Program code can be applied to input data to perform the functions described herein and to generate output information. The output information is applied to one or more output devices. Program code, in the context of power electronics, may include control waveform inputs (e.g., gated inputs to turn switches on and off), and waveform generators for generating control waveforms thereof.

The term "connected" or "coupled to" may include both direct coupling (in which two elements that are coupled to each other contact each other) and indirect coupling (in which at least one additional element is located between the two elements).

The technical solution of embodiments may be in the form of a software product (e.g., a waveform generator control software). The software product may be stored in a non-volatile or non-transitory storage medium, which can be a compact disk read-only memory (CD-ROM), a USB flash disk, or a removable hard disk. The software product includes a number of instructions that enable a computer device (e.g. personal computer, server, virtual environment, cloud computing system, network device) to execute the methods provided by the embodiments.

The embodiments described herein provide useful physical machines and particularly configured electronic hardware combinations. The embodiments described herein are directed to electronic machines and methods implemented by electronic machines adapted for processing and transforming electromagnetic signals which represent various types of information.

The embodiments described herein pervasively and integrally relate to machines, and their uses; and the embodiments described herein have no meaning or practical applicability outside their use with electronic hardware, machines, and various hardware components.

Although the embodiments have been described in detail, it should be understood that various changes, substitutions and alterations can be made herein without departing from the scope. Moreover, the scope of the present application is not intended to be limited to the particular embodiments of the process, machine, manufacture, composition of matter, means, methods and steps described in the specification.

As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized. Accordingly, the appended claims are intended to include within their scope such processes, machines, manufacture, compositions of matter, means, methods, or steps.

As can be understood, the examples described above and illustrated are intended to be exemplary only.

Any and all features of novelty or inventive step described, suggested, referred to, exemplified, or shown herein, including but not limited to processes, systems, devices, and computer-readable and -executable programming and/or other instruction sets suitable for use in implementing such features are claimed.

What is claimed is:

1. A single-mode quasi constant frequency controller apparatus for controlling output voltage deviation during one or more load transients, the controller apparatus comprising:
   a polarity detector;
   a converter receiving one or more operational control parameters;
   a load tracking modulator configured to receive sensory inputs representative of a capacitor current polarity, and to control one or more power transistors of the converter such that an inductor current matches a load current cycle and reconstructs a desired inductor current ripple by splitting both an on-time for inductor charging and an off-time for inductor discharging into a current correction phase (CCP) and a ripple reconstruction phase (RRP), the load tracking modulator communicating the one or more operational control parameters for controlling the one or more power transistors, the load tracking modulator including a first half duty digital pulse width modulator and a second half duty digital pulse width modulator, the first half duty digital pulse width modulator and the second half duty digital pulse width modulator being configured to control the one or more power transistors based on an output of the polarity detector.

2. The controller apparatus of claim 1, wherein the polarity detector is configured to sense the capacitor current polarity.

3. The controller apparatus of claim 2, wherein a positive capacitor current polarity triggers an onset of the RRP.

4. The controller apparatus of claim 3, wherein during the RRP, the load tracking modulator controls the converter to maintain an on-time for an additional period to reconstruct a ripple.

5. The controller apparatus of claim 1, wherein during the one or more load transients where the one or more load transients are light to heavy transients, a corresponding load current resultant from a corresponding load transient causes an extension of a CCP duration during the on-time of the converter.

6. The controller apparatus of claim 1, wherein during the one or more load transients where the one or more load transients are heavy to light transients, a corresponding load current resultant from a corresponding load transient causes an extension of a CCP duration during the off-time of the converter.

7. A single-mode quasi constant frequency controller apparatus for controlling output voltage deviation during one or more load transients, the controller apparatus comprising:
   a polarity detector configured to sense a capacitor current polarity;
   a converter receiving one or more operational control parameters;
   a load tracking modulator configured to receive sensory inputs representative of the capacitor current polarity, and to control one or more power transistors of the converter such that an inductor current matches a load current cycle and reconstructs a desired inductor current ripple by splitting both an on-time for inductor charging and an off-time for inductor discharging into a current correction phase (CCP) and a ripple reconstruction phase (RRP), the load tracking modulator communicating the one or more operational control parameters for controlling the one or more power transistors, wherein a positive capacitor current polarity triggers an onset of the RRP, wherein during the RRP, the load tracking modulator controls the converter to maintain an on-time for an additional period to reconstruct a ripple.

* * * * *